United States Patent
Chen et al.

(10) Patent No.: US 9,859,322 B2
(45) Date of Patent: Jan. 2, 2018

(54) METHODS AND APPARATUS FOR GLASS REMOVAL IN CMOS IMAGE SENSORS

(71) Applicant: Taiwan Semiconductor Manufacturing Company, Ltd., Hsin-Chu (TW)

(72) Inventors: Pao-Tung Chen, Tainan Hsien (TW); Szu-Ying Chen, Toufen Township (TW); Dun-Nian Yaung, Taipei (TW); Jen-Cheng Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 63 days.

(21) Appl. No.: 15/070,952

(22) Filed: Mar. 15, 2016

(65) Prior Publication Data
US 2016/0197115 A1    Jul. 7, 2016

Related U.S. Application Data

(62) Division of application No. 13/713,871, filed on Dec. 13, 2012, now Pat. No. 9,287,310.

(60) Provisional application No. 61/625,969, filed on Apr. 18, 2012.

(51) Int. Cl.
    *H01L 21/304*      (2006.01)
    *H01L 27/146*      (2006.01)

(52) U.S. Cl.
CPC .. *H01L 27/14636* (2013.01); *H01L 27/14632* (2013.01); *H01L 27/14687* (2013.01); *H01L 27/14689* (2013.01); *H01L 27/1464* (2013.01); *H01L 27/14627* (2013.01); *H01L 27/14634* (2013.01); *H01L 2924/0002* (2013.01)

(58) Field of Classification Search
CPC .................................................. H01L 21/304
See application file for complete search history.

(56) References Cited

U.S. PATENT DOCUMENTS

| | | | |
|---|---|---|---|
| 7,586,139 B2 | 9/2009 | Adkisson et al. | |
| 8,049,256 B2 | 11/2011 | Guidash | |
| 2002/0030189 A1 | 3/2002 | Ishikawa | |
| 2008/0083939 A1* | 4/2008 | Guidash | H01L 27/14634 257/292 |
| 2009/0181490 A1* | 7/2009 | Weng | H01L 27/14618 438/69 |
| 2009/0224343 A1 | 9/2009 | Akram | |

(Continued)

FOREIGN PATENT DOCUMENTS

| | | |
|---|---|---|
| JP | 2007221134 A | 8/2007 |
| KR | 100223870 | 7/1999 |

(Continued)

*Primary Examiner* — Daniel Whalen
(74) *Attorney, Agent, or Firm* — Slater Matsil, LLP

(57) ABSTRACT

Methods for glass removal while forming CMOS image sensors. A method for forming a device is provided that includes forming a plurality of pixel arrays on a device wafer; bonding a carrier wafer to a first side of the device wafer; bonding a substrate over a second side of the device wafer; thinning the carrier wafer; forming electrical connections to the first side of the device wafer; subsequently de-bonding the substrate from the second side of the device wafer; and subsequently singulating individuals ones of the plurality of pixel arrays from the device wafer. An apparatus is disclosed.

20 Claims, 12 Drawing Sheets

(56) References Cited

U.S. PATENT DOCUMENTS

2010/0006963 A1   1/2010   Brady
2012/0049307 A1*  3/2012   Huang ............. H01L 27/14618
                                                        257/432

FOREIGN PATENT DOCUMENTS

KR      20090077904 A      7/2009
WO       2008045356 A2     4/2008

* cited by examiner

METHODS AND APPARATUS FOR GLASS REMOVAL IN CMOS IMAGE SENSORS

CROSS REFERENCE TO RELATED APPLICATIONS

This application is a divisional of U.S. patent application Ser. No. 13/713,871, filed on Dec. 13, 2012, and entitled "Methods and Apparatus for Glass Removal in CMOS Image Sensors" which claims priority to U.S. Provisional Patent Application No. 61/625,969; entitled "Glass-removal TSV Method for CMOS Image Sensors and Resulting Structures", filed Apr. 18, 2012, which are herein incorporated in their entirety by reference.

BACKGROUND

The industry drive toward smaller size packages for integrated circuits is driving the adoption of 3D stacking of dies with TSV (Through Silicon Via, sometimes Through Substrate Via) connections as well as wafer level packaging of devices. These technologies will become increasingly advantageous in the field of CMOS image sensors.

In a conventional fabrication process, an active device wafer including, for example, CMOS image sensors devices, is provided. Color filter array (CFA) and microlens (ML) materials may be formed over the CMOS image sensors. The CFA and ML material is disposed in locations corresponding to photodiodes in the CMOS image sensors so that impinging light may be directed onto the photodiodes.

A glass substrate may be bonded over the active device wafer and over the photodiodes. On an opposing surface of the structure, a through via process such as TSV may be performed to open vias to metallization layers. An isolation oxide may be formed in the through vias. A conductor material may be deposited in the through vias and may extend to the metallization layers to form an electrical connection to the CMOS image sensor devices. A redistribution layer (RDL) may be formed over the through vias and patterned to form traces. External connectors may be formed on the traces to complete a package for the CMOS image sensor devices. A sawing or dicing operation may then separate the active device wafer, the glass substrate, into individual integrated circuit modules each forming CMOS image sensor devices for use in a system.

Traditional CIS devices involve limitations, such as (1) the top glass layer, used in manufacturing the device, reduces the optical performance; and (2) the CTE (Coefficient of Thermal Expansion) mismatch between, e.g., the active device wafer upon which the device is formed, and, e.g., a glass substrate used for manufacturing, induces wafer warping and bowing, resulting in performance non-uniformity and reliability concerns.

BRIEF DESCRIPTION OF THE DRAWINGS

For a more complete understanding of the illustrative embodiments, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of example illustrative embodiments are discussed in detail below. It should be appreciated, however, that the embodiments provide many applicable inventive concepts that can be embodied in a wide variety of specific contexts. The specific example embodiments discussed are merely illustrative of specific ways to make and use the embodiments, and do not limit the scope of the application, the embodiments, or the appended claims.

Illustrative embodiments include glass-removal steps on active device wafers with through-vias, including, e.g., CMOS image sensors (CIS), which provide for improved performance and reliability. Advantageous features of the disclosed embodiments may include, but are not limited to increasing the transmittance of a light source for improved optical performance—e.g., improved quantum efficiency (QE) for the image sensors; and avoiding coefficient of thermal expansion (CTE) mismatch between a Si wafer upon which the device is formed and a glass substrate as used in prior approaches.

Generally speaking the embodiments illustrated in the accompanying figures provide for a glass substrate attached to a CIS wafer by a temporary bonding material. After appropriate process steps, the glass substrate may be de-bonded from the CIS wafer simply by heating, or by the use of UV to release a UV sensitive adhesive, or by the use of chemical release agents. In the thermal release case, heat applied over a critical temperature changes the properties of a temporary adhesive and releases the glass substrate. The de-bonding occurs before dicing the CIS wafer into individual devices (e.g., dies). The CIS wafer may then be cleaned to remove any adhesive residue and processing continues with dicing to singulate the devices, and the individual CIS devices may then be used in a system, for example.

Although the examples presented herein to illustrate the embodiments describe active device wafers that include CMOS image sensors, the methods may be applicable to other types of wafers that are processed using carrier substrates. For example, wafer thinning operations can be performed for the fabrication of through-vias on any number of different types of devices, including processors such as digital signal processors, analog processors, microprocessors, RISC or ARM processors, that may be combined in 3D structures with other devices such as volatile and non-volatile memory devices. Processing on the back side of the active device wafer may require that the wafer be temporarily bonded to a glass substrate. Use of the embodiments is applicable to many different wafer processing contexts and is not limited to the specific examples described herein, which are active device wafers including front side illuminated (FSI) and back side illuminated (BSI) CMOS image sensors.

Figure 1:
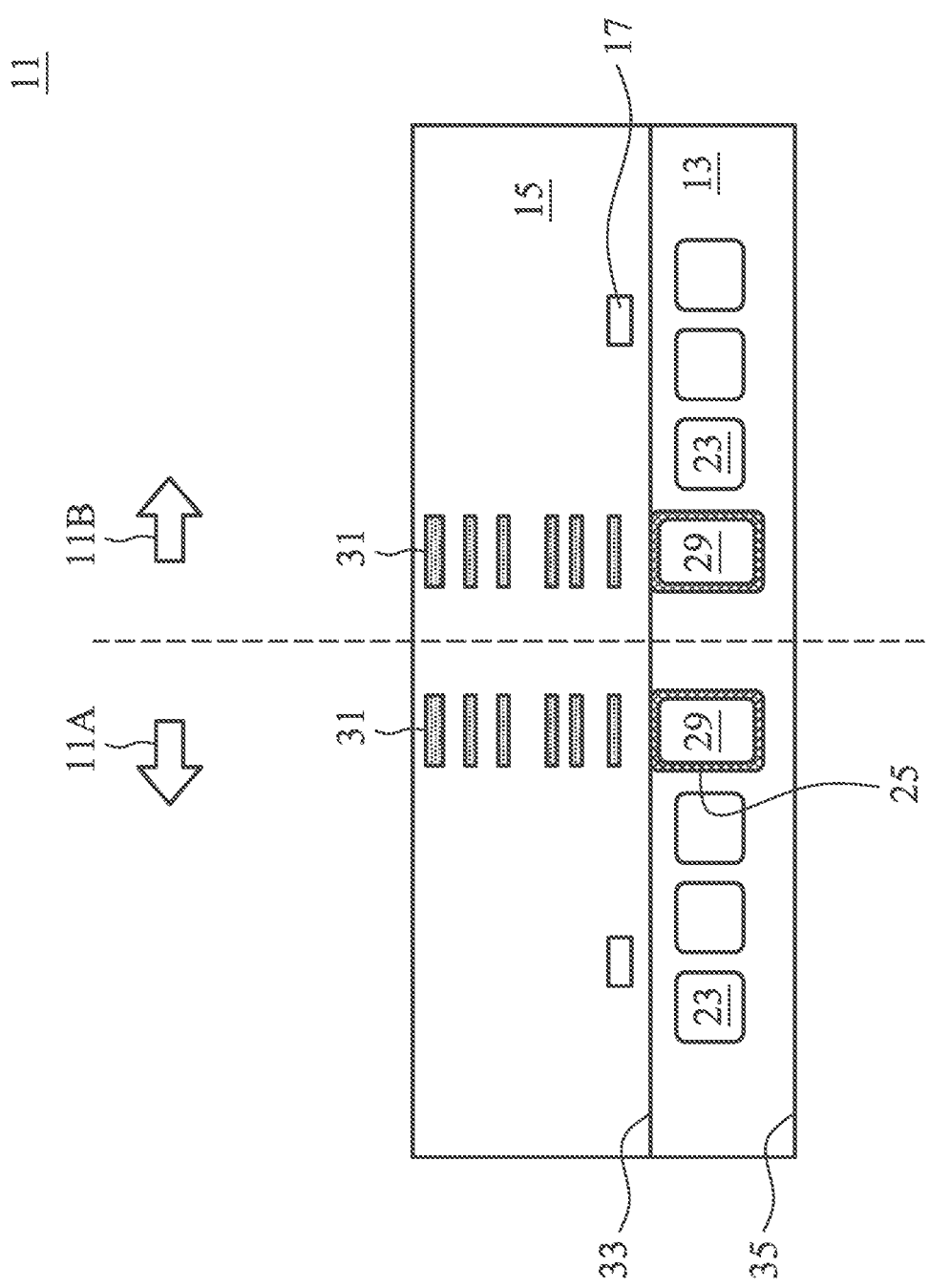
FIG. 1 depicts, in a cross sectional view, an active device wafer which is a FSI CIS example device for use with the embodiments.

Turning now to the illustrated embodiments, FIG. 1 illustrates in a cross sectional view an active device wafer 11 including front side illuminated (FSI) image sensor devices 11A and 11B at an intermediate stage of manufacture. As shown, a pixel array of photodiodes 23 has been formed on a semiconductor wafer 13 for each of two devices 11A and 11B. Various electrical components have been formed in back end of line (BEOL) layers 15 over the wafer 13, as is generally known in the art. For example, polysilicon gate material 17 may be formed over the photodiodes 23 and other devices, such as transistors, capacitors, diodes and the like may be formed in the wafer 13 or in the BEOL layer 15. The semiconductor wafer 13 includes portions of two CIS devices 11A and 11B, which are formed on either side of a central portion of wafer 13. As shown, the photodiodes 23 form two pixel arrays on either side of the external pad metallization layers 31, and the symmetric structures form symmetric sensor devices 11A and 11B on the wafer 13, although only a small portion of wafer 13 is illustrated. In a practical active device wafer 11, each sensor 11A and 11B would have many millions of photodiodes 23 and the semiconductor wafer 13 would have many sensor devices such as 11A and 11B formed thereon. That is, in a practical active device wafer many sensor devices would be formed, each having millions of photodiodes in arrays and including access transistors, reset transistors, and transfer transistors for reading the stored charge after receiving light.

The BEOL layers 15 also include several metallization layers from a first metal layer, or metal-1, usually the metal layer nearest the surface of the wafer 13, to a top level metal or top metal, near the upper surface of the BEOL layers 15. The metallization layers 31 form the external connections to the photodiodes and may include copper metallization or aluminum metallization or combinations of these. Single or dual damascene processes may be used to form the metallization layers. The wafer 13 has the BEOL layers 15 on a front side surface 33, and wafer 13 has an opposing back side surface 35. Through-vias 29 are shown formed into the wafer 13. These through-vias are formed during front end of the line (FEOL) processes and may be formed by a silicon etch, or laser drilling operation, which forms deep trenches into the wafer 13. The through-vias 29 may be formed in a via first process, for example. The through-vias 29 may be lined with a barrier material 25 which may be an oxide, silicon nitride, or similar barrier material and which may include tantalum or titanium and nitride, for example. The through-vias 29 are filled with a conductor. Aluminum or copper or the like may be used, electroplating or other metal deposition such as PVD may be used to form the conductors. Alternatively, conductive plugs such as tungsten plugs may be used to fill the through-vias 29.

Figure 2:
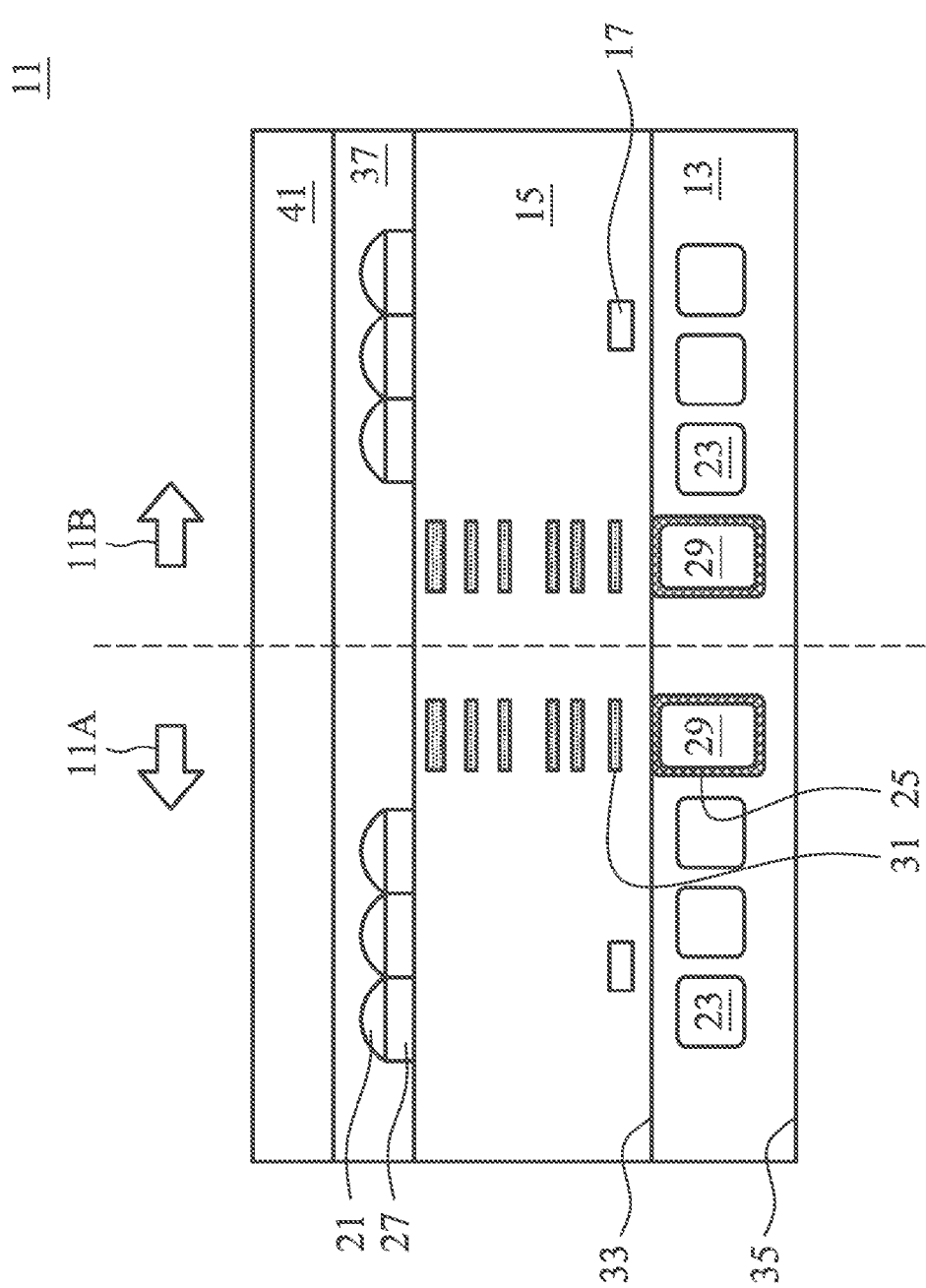
FIG. 2 depicts, in a cross sectional view, the active device wafer of FIG. 1, following additional processing.

FIG. 2 depicts in another cross sectional view the active device wafer following additional processing. In FIG. 2, color filter array (CFA) material 27 is formed over the exposed surface of the BEOL layer 25. The CFA material passes certain light spectrum to a corresponding photodiode 23 and with the photodiodes forms an array of color pixels. Red, green and blue (RGB) color filters may be used, for example. Microlens (ML) material 21 is then formed over the color filter array material 27 and increases performance in the system by focusing incipient light onto the photodiodes 23 through the color filter array material. The CFA and ML materials may be formed using a coating or other deposition step and a subsequent photolithographic process to pattern the coating using a photoresist that is patterned over the coating layer, to form an etch mask for example, and a patterning step, followed by a photoresist strip for example.

As described above the cross sectional view of active device wafer 11 depicts a portion of two CIS sensor devices 11A and 11B that are formed simultaneously using wafer level processing, and so there are shown two symmetrically positioned portions of CFA material and ML material, one portion for each of the two devices. In a practical active device wafer, hundreds or more of the CIS sensor devices will be arranged on a single wafer 13.

A temporary bonding material 37 is formed over the CFA 27 and ML 21 material. This temporary bonding material may be, as an example embodiment, a heat release adhesive used for semiconductor processes. For one non-limiting and illustrative example, WaferBOND™ HT is a heat release temporary adhesive available from Brewer Science, Inc. in Rolla, Mo., USA. This material provides a heat releasable temporary bonding adhesive for bonding wafers or substrates. The bond is later released by application of heat over a critical temperature. Alternative materials for the temporary bonding material include UV releasable adhesives and chemical release adhesives, which form alternative embodiments. These materials may be applied as a liquid that is spun on to the wafer, or, applied as a film, or provided as tape material. Additional alternatives include pressure release bonding materials, for example. The materials are designed so that when the release step is performed, the bonding material transitions from an adhesive property to a non-adhesive property, enabling release.

A glass or other like substrate 41 is then adhered to the front side surface of the active device wafer 11 by use of the temporary bonding material 37. The glass substrate 41 provides mechanical support to the wafer 13 during the various processes that follow. These are described below and may include, among other processes, wafer thinning of the wafer 13. The resulting very thin wafer 13 will be flexible and without the additional mechanical support, might not be able to withstand the various additional process steps described below.

Figure 3:
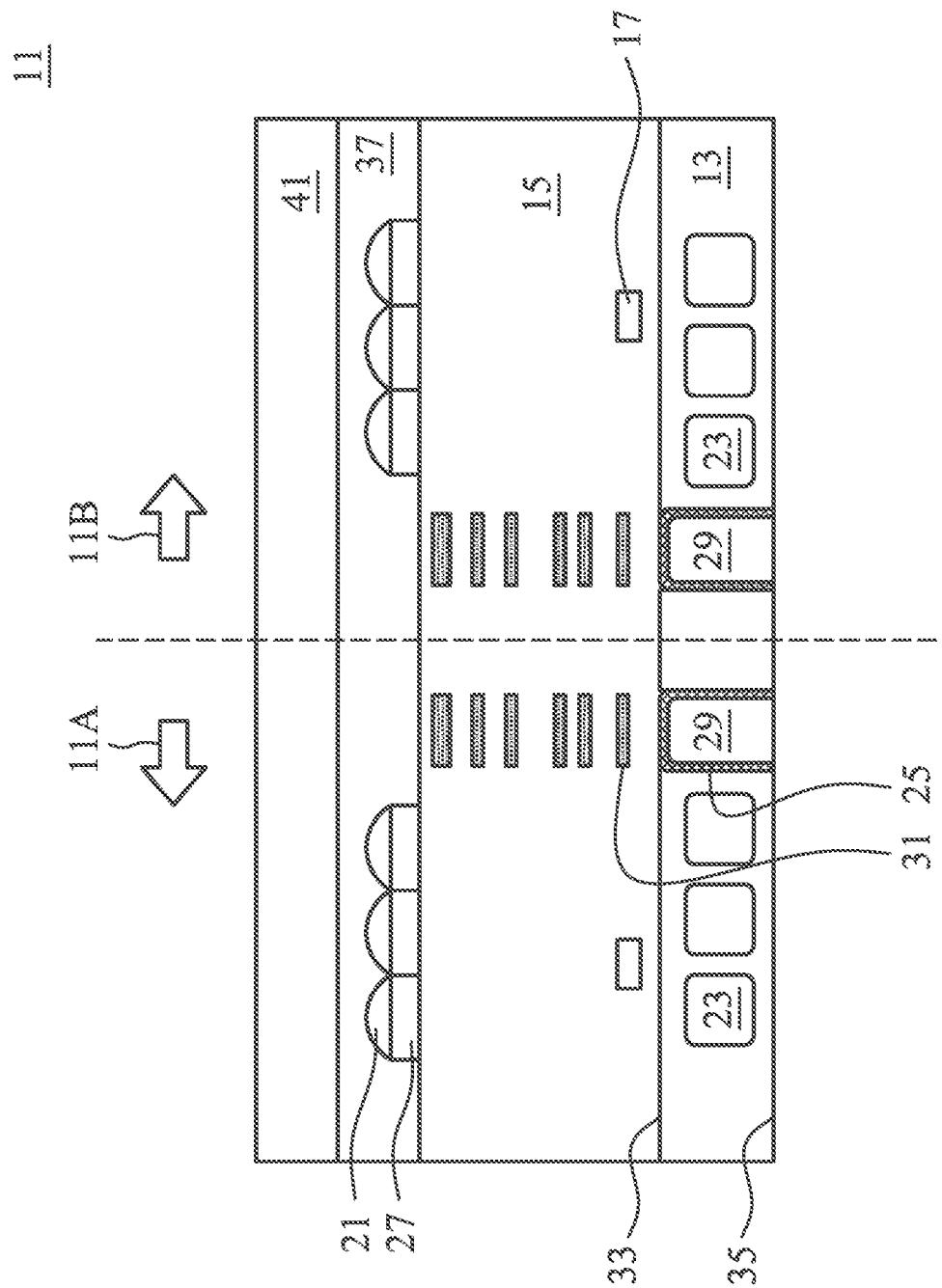
FIG. 3 depicts, in a cross sectional view, the active device wafer of FIG. 2, following additional processing.

FIG. 3 depicts, in another cross sectional view, the active device wafer 11 following additional processing steps. To transition from the process stage of FIG. 2 to the stage shown in FIG. 3, the back side surface 35 of wafer 13 is thinned. The wafer thinning proceeds at least to a point where the wafer 13 is thin enough so that the bottom portion of the through-vias 29 is exposed. This wafer thinning may be done by using one or more of mechanical grinding, chemical substrate etches, and chemical mechanical polishing (CMP) to remove the wafer material. After the wafer thinning process, the wafer 13 may be as thin as 200 microns or less, and may be in a thickness range from 80 to 250 microns. In an example embodiment, a thickness of 100 microns was used.

The through-vias 29 now extend from the back side 35 of the wafer 13 and provide an electrically conductive path through the wafer 13 to the metallization layers 31 of the BEOL layer 15. As described further below, the through-vias 29 can now form the electrical connections from the back side of the active device wafer 11 to the photodiodes 23, or to other circuitry, for example.

Figure 4:
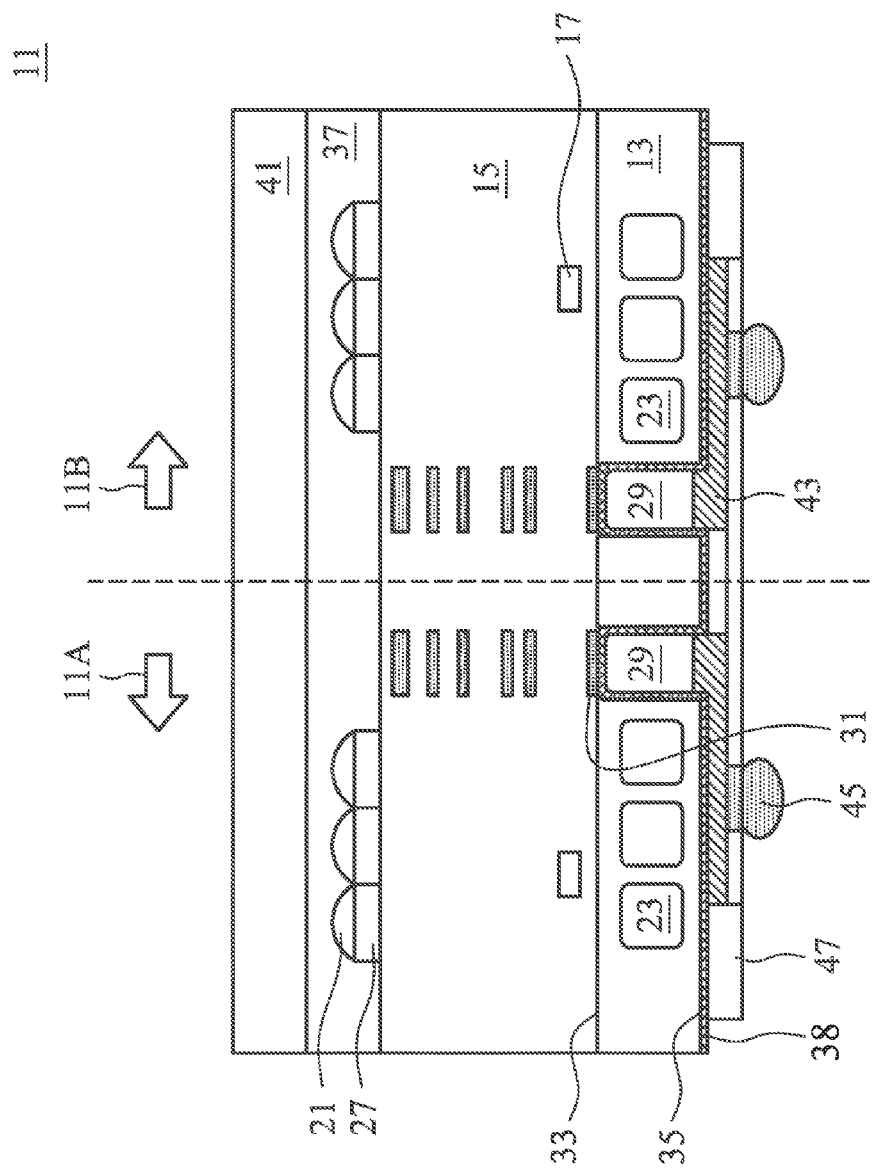
FIG. 4 depicts, in a cross sectional view, the active device wafer of FIG. 3, following additional processing.

FIG. 4 depicts in another cross sectional view the active device wafer 11 following additional processing steps. To transition from the stage shown in FIG. 3 to the stage of FIG. 4, several steps were performed. An isolation layer 38 was formed over the back side surface 35 of the wafer 13. This may be a thermal oxide, or it may be formed by CVD, PECVD and the like. Other dielectrics such as silicon nitrides or silicon oxynitrides may be used. A conductive redistribution layer (RDL) 43 is formed over the isolation layer 38 and extends in openings in the isolation layer 38 to the through-vias 29; the conductive RDL material forms an electrical connection to the through-vias 29. The RDL layer 43 may be copper, aluminum or alloys of these and may be electroplated, or otherwise deposited. For example, a PVD deposition process may be used to deposit the RDL. A passivation layer 47 is formed over the RDL layer 43. Openings are formed in the passivation layer, which may be a silicon nitride, a polymer layer, polyimide or other passivation material. External connectors such as ball grid array (BGA) terminals 45 are formed in the openings and extend to the RDL layer 43 and through the passivation layer 47 in the openings. The external connectors 45 will form the electrical connections to the system for the finished CIS sensor devices. External connectors 45 are shown in FIG. 4 as BGA solder balls and may be formed by use of a solder plating process, followed by a thermal reflow to shape the solder balls. Solder bumps may be used. Conductive pillars such as copper pillars may be used. Stud bumps or wire bond ball bumps may be used. Columns, pillars, balls and bumps are all possible shapes for the external connectors 45. Copper and alloys including nickel and gold may be used. The solder balls 45 could be formed of lead based solder or lead free solder including silver, tin, copper eutectics. External finishes such as electroless nickel, immersion gold (ENIG), and electroless nickel electroless palladium immersion gold (ENEPIG), gold, nickel and alloys of these may be used, for example.

Figure 5:
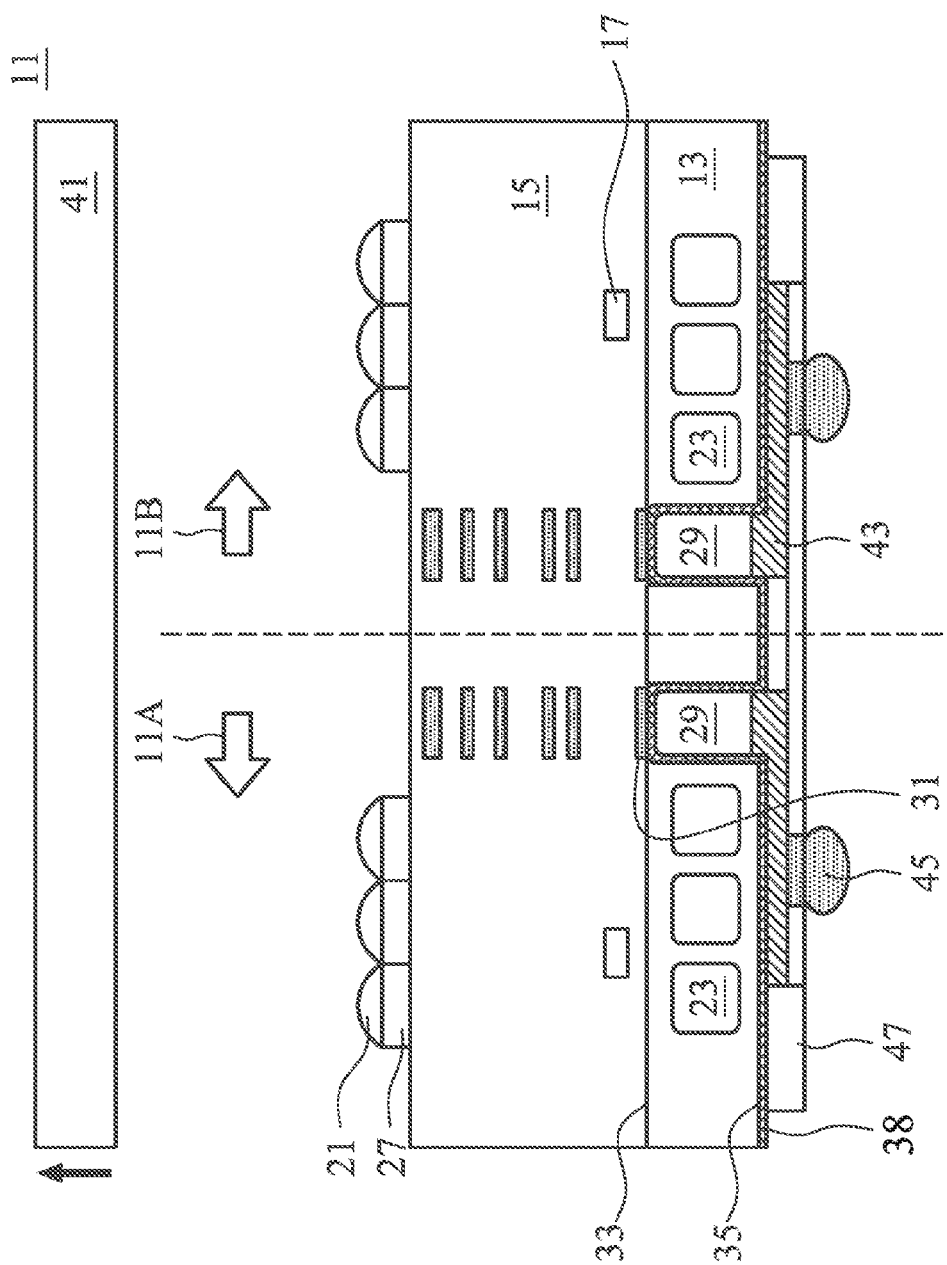
FIG. 5 depicts, in a cross sectional view, the view the active device wafer of FIG. 4, following a de-bonding process.

FIG. 5 depicts in cross section the active device wafer 11 in a de-bonding process. The temporary bonding material 37 (not shown in FIG. 5, see FIG. 4 for example) has been removed. These materials are formed with a release mechanism that changes the material from an adhering material to a non-adhesive material. The Waferbond™ HT material is a heat release material. Other temporary bonding materials may be UV released, that is, the material is sensitive to certain light energy such as ultra-violet light, and will transition to a release state when exposed to UV. Some materials may release with mechanical pressure or with exposure to chemical release agents that cause a transition in the material.

After the de-bonding step, for example by applying sufficient heat, is performed, the glass substrate 41 is removed from the front side of active device wafer 11. By removing the glass substrate 41 at this stage, several advantages result due to use of the embodiments. Unlike in the prior approaches, where the glass substrate remains over the CIS sensors in the finished devices, with the embodiment structure such as in FIG. 5, incipient light into the CIS sensors is not impeded by the glass substrate and the bonding material, which are both removed with use of the embodiments. The amount of incipient light is therefore increased at the photodiodes, thus increasing the quantum efficiency (QE) of the sensors.

Further, the removal of the glass substrate at this stage also removes a source of CTE mismatch in subsequent processes, and a potential CTE mismatch when the finished sensors are used in a system application. Because glass 41 and the silicon or semiconductor wafer 13 have substantially different thermal properties, if the glass is kept as part of the finished sensors, warping and bowing of the silicon wafer 13 may occur either in the various processes that follow, such as dicing, or during use of the sensor in a system.

Figure 6:
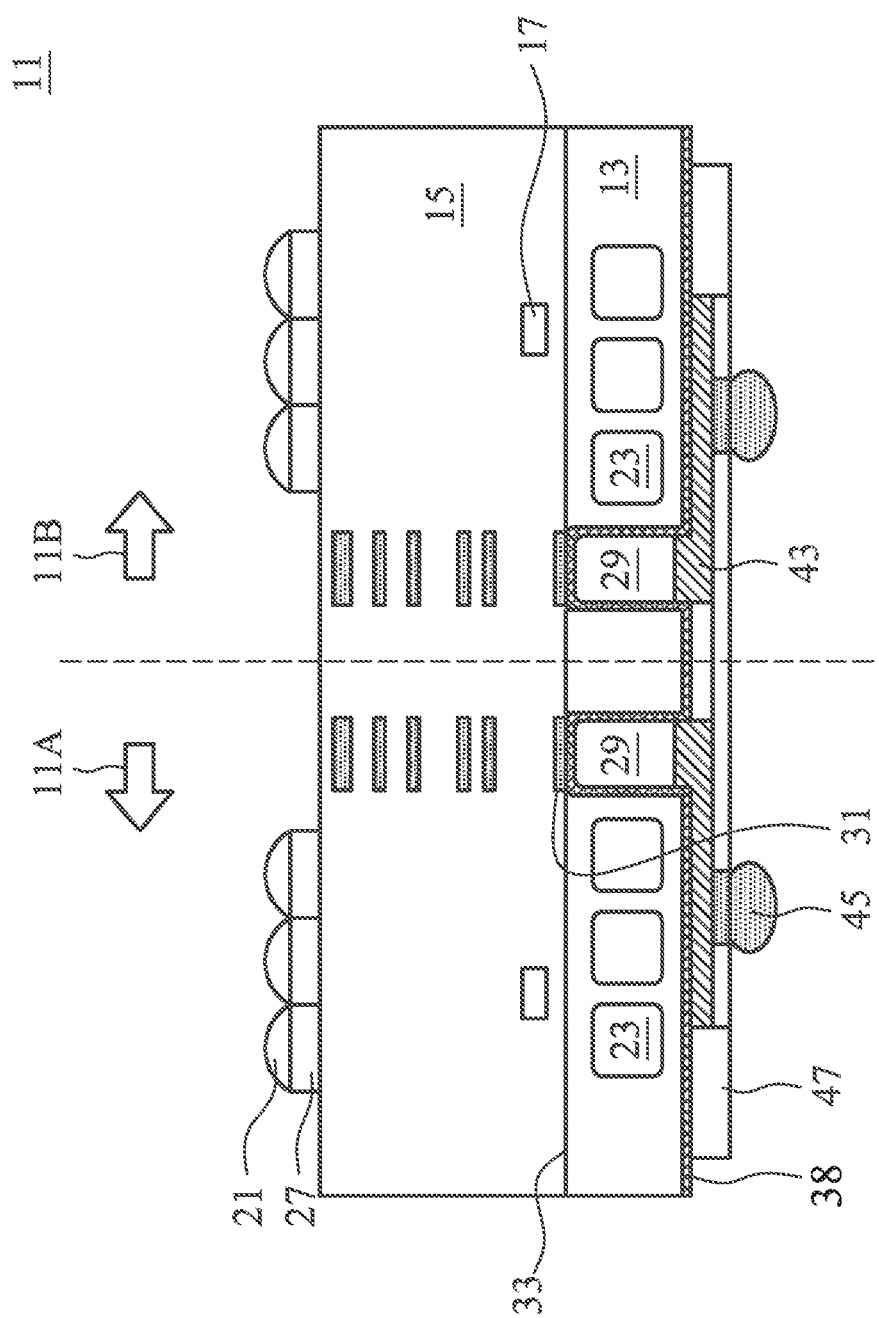
FIG. 6 depicts, in a cross sectional view, the active device wafer of FIG. 5, in a singulation process.

FIG. 6 illustrates is a cross sectional view the active device wafer 11 in a dicing operation that separates the CIS sensors 11A and 11B from one another by dicing the wafer 13 into individual integrated circuit devices, or dies. The dicing operation may be performed by a mechanical wafer sawing, by laser dicing, or by combinations of these, by scribing, trenching and etching operations, and combinations of these or like operations. In the embodiment methods, when the glass substrate 41 is removed prior to the dicing operation (see FIG. 5 above) the dicing operation is less stressful as only wafer 13 has to be cut through, in contrast to prior approaches which required sawing both silicon wafers and the glass substrates at the same time, thus use of the embodiments further reduce vibration and mechanical stress on the active device wafer.

After the CIS sensors 11A and 11B are separated as indicated by the arrows in FIG. 6, these individual integrated circuit devices (dies) may then be mounted to a system board or another substrate using the BGA terminals 45 as connectors. The sensor microlens 21 and color filter array 27 materials are not surrounded by any bonding material, and there is no glass substrate between the sensor devices and the system lens, thus the incipient light on the photodiodes is increased when compared to prior FSI CIS structures. The microlens material is exposed to air or perhaps a vacuum in the ambient environment and light from a system lens is not required to traverse any other materials prior to impinging on the microlens material 21.

Figure 7:
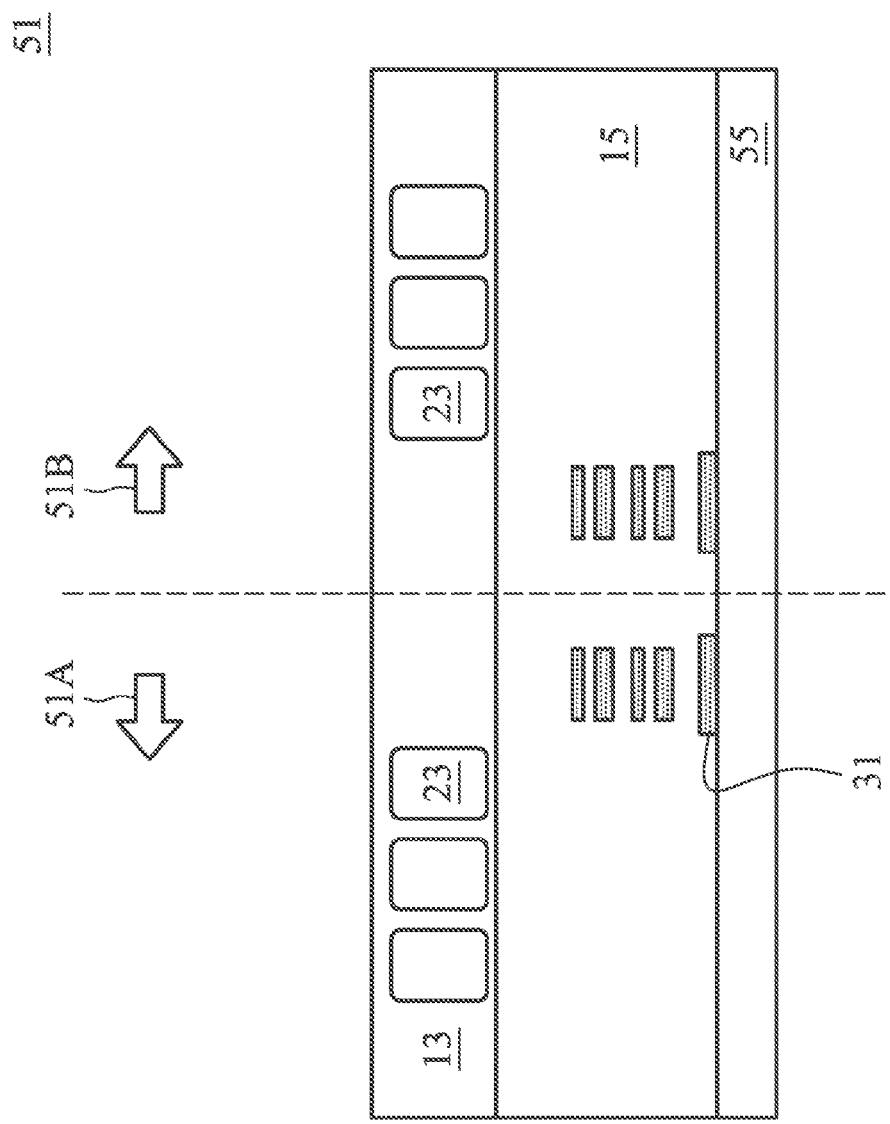
FIG. 7 depicts, in a cross sectional view, an active device wafer which is a BSI CIS example device for use with the embodiments.

FIG. 7 depicts in a cross sectional view an intermediate stage of another illustrative embodiment. In FIG. 7 an active device wafer 51 is depicted and will form back side illuminated (BSI) sensors. Several elements of this alternative embodiment are the same as for the FSI embodiments shown in FIGS. 1-6, and like numerals are used for like elements. In FIG. 7, a semiconductor wafer 13 such as a silicon wafer is shown with photodiodes 23 formed therein. As shown for explanation in FIG. 7, the wafer 13 is rotated 180 degrees from the illustrative views above in FIGS. 1-6 so that the BEOL layer 15 including external pad metallization layers 31 are shown beneath the wafer 13, that is, the front side surface is below the wafer 13. A carrier wafer 55 is wafer bonded to the BEOL layer 15. The carrier wafer 55 may be a silicon wafer, or another semiconductor wafer such as gallium arsenide, indium, germanium, or the like.

As described above, the active device wafer 51 includes many CIS sensor devices. The portion of the wafer 51 shown in FIG. 7 depicts only a portion of two devices 51A and 51B that are arranged symmetrically around a center line. Each BSI image sensor device 51A and 51B has at array of photodiodes 23 in wafer 13, and metallization layers 31 in BEOL layer 15, bonded to carrier wafer 55. In a practical device wafer many sensor devices would be formed, each having thousands of photodiodes in arrays and including access transistors, reset transistors, and transfer transistors for reading the stored charge after receiving light.

Figure 8:
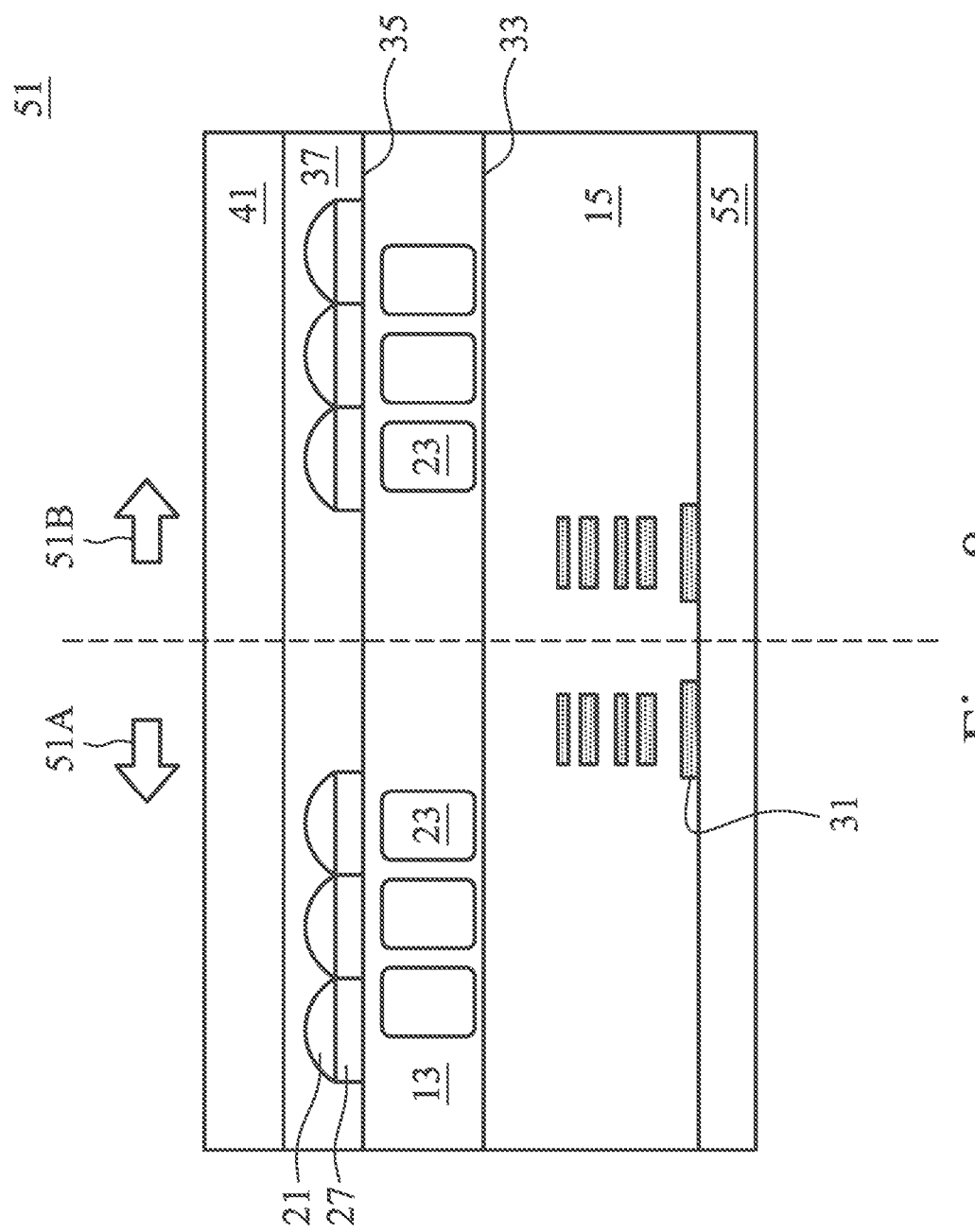
FIG. 8 depicts, in a cross sectional view, the active device wafer of FIG. 7, following additional processing.

FIG. 8 depicts in a cross sectional view the active wafer device 51 following additional processing steps. In transitioning from the intermediate process stage shown in FIG. 7 to the stage of FIG. 8, color filter array material 27 is formed over the back side surface 35 of the wafer 13. Microlens material 21 is formed over the color filter array material 27. In contrast to the FSI embodiments of FIGS. 1-6, the light impinging on the photodiodes 23 in the embodiments using BSI will not traverse through BEOL layer 15, and thus, the amount of light impinging on the photodiodes 23 will be increased for the BSI CIS devices, increasing the efficiency. For this reason, the use of BSI image sensors is increasing, although as shown above the embodiments are not limited to BSI embodiments.

In FIG. 8, a temporary bonding material 37 is applied over the CFA 27 and the ML 21 materials. This material forms an adhesive and a glass substrate 41 is positioned over the wafer 13 and temporarily bonded using the bonding material 37. As described above this bonding material 37 may be a heat releasable material, or a UV or chemical releasable bonding material may be used as alternative embodiments.

Figure 9:
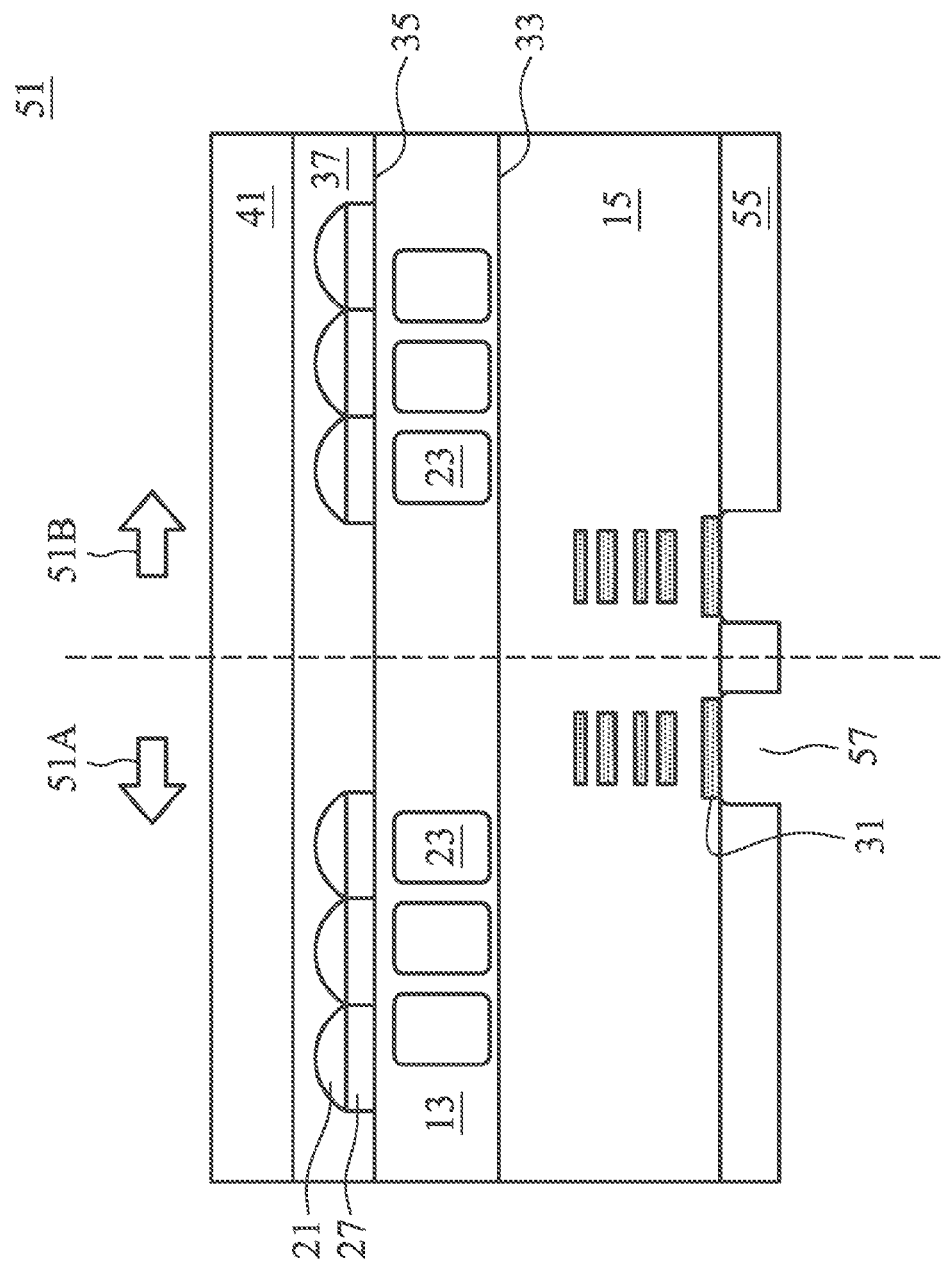
FIG. 9 depicts, in a cross sectional view, the active device wafer of FIG. 8, following additional processing.

FIG. 9 depicts, in another cross sectional view, the active device wafer 51 following additional processing steps. In FIG. 9, the carrier wafer 55 has been thinned using a wafer thinning process, which may include CMP, mechanical grinding, silicon etch, or combinations of these to reduce the carrier wafer thickness to a range of 80 to 250 microns, for example, in an embodiment, 100 microns was used.

After the wafer thinning process on the carrier wafer 55 is performed, photolithography and etch processes are used to etch vias 57 through the carrier wafer 55. These vias will form through-vias to the external pad portion of the metallization layers 31 for each device 51A and 51B shown. The carrier wafer etch may be performed using dry etch such as an RIE etch for example, plasma etch or other silicon etch processes could be used.

Figure 10:
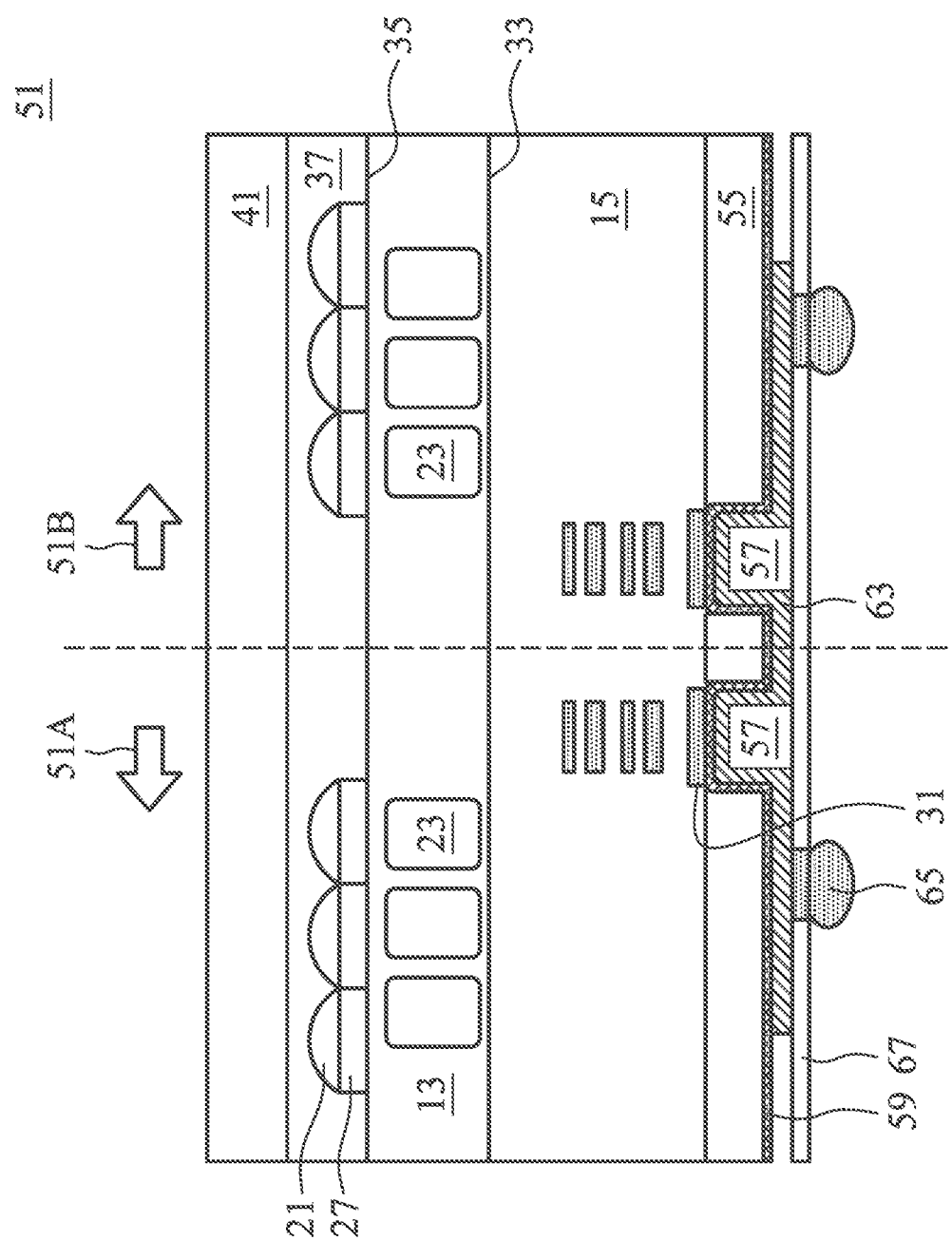
FIG. 10 depicts, in a cross sectional view, the active device wafer of FIG. 9, following additional processing.

FIG. 10 depicts in a cross sectional view the active device wafer 51 of FIG. 9 following additional processing steps. In transitioning from the intermediate stage shown in FIG. 9 to FIG. 10, the external connections and passivation processes are performed. An isolation layer 59 is formed over the exposed surface of the carrier wafer 55. This isolation layer may be a thermal oxide, or may be a nitride or oxynitride or the like. The isolation layer 59 may be thermally grown or deposited using CVD, PECVD or like oxide deposition processes. The isolation layer 59 is opened in the through-vias 57 by an oxide etch. An RDL layer 63 is then deposited. The conductive RDL layer 63 is formed into the through-vias 57 and contacts the pad portion of the metallization layers 31. In this manner, electrical connection may be made to the photodiodes 23 in the active wafer devices, for example, from the exposed surface of carrier wafer 55. A passivation layer 67, which may be silicon nitride, or a polyimide, or the like, is formed over the RDL layer 63. The passivation layers is then opened by photolithography and etch over selected portions of the RDL layer 63, which form traces on the bottom of the carrier wafer 55. External connectors 65, which may be solder balls for a ball grid array (BGA) package, for example, are formed into these openings to make external connections to the RDL layer 63. The external connectors 65 may be solder balls, solder bumps, conductive pillars such as copper pillars, conductive columns, stud bumps, wire bond bumps, or the like, as described above. Finish platings may be formed over the external connections 65, as described above.

Figure 11:
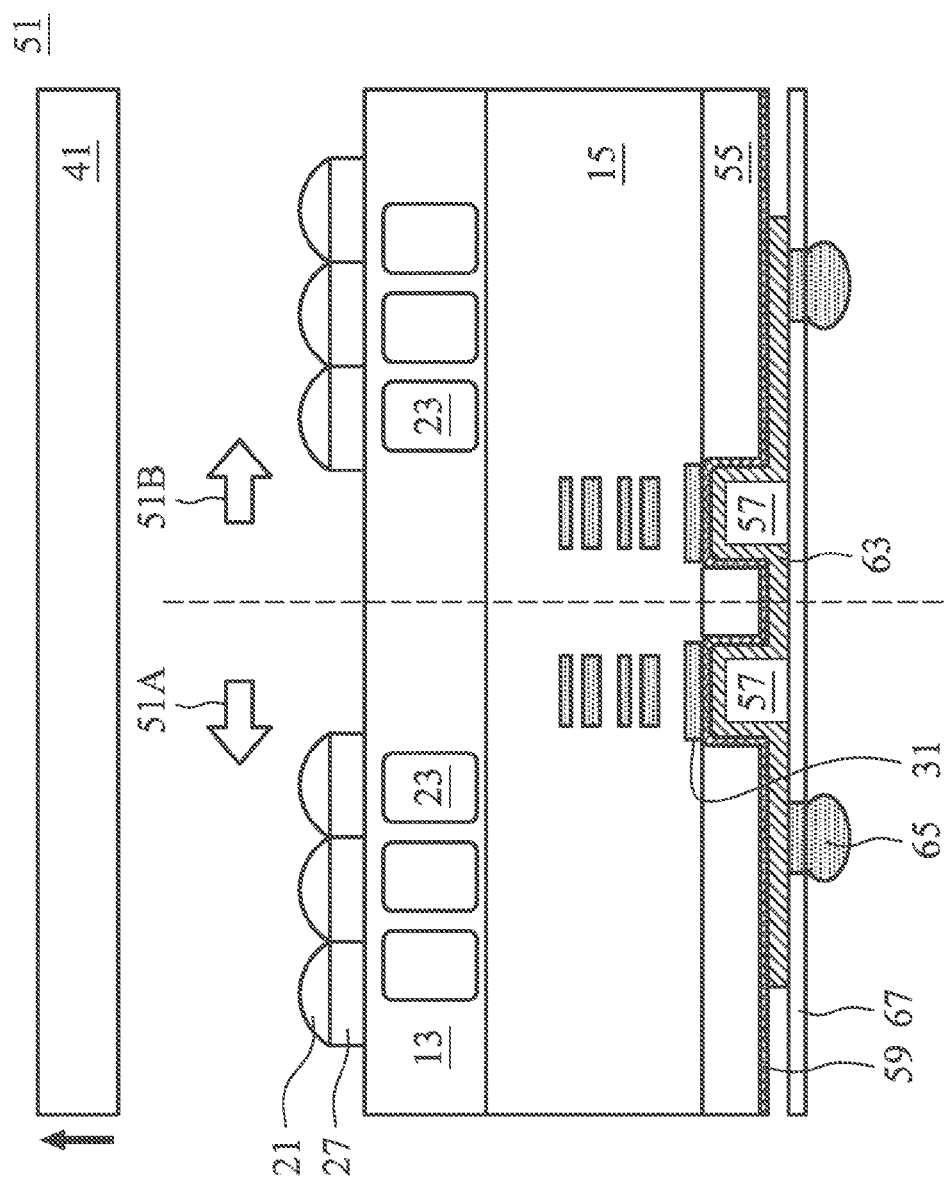
FIG. 11 depicts, in a cross sectional view, the view the active device wafer of FIG. 10, in a de-bonding process.

FIG. 11 depicts the glass substrate 41 being de-bonded from the active device wafer 51. The temporary bonding material (not visible) is processed to release the substrate 41. In an illustrative embodiment a heat release bonding material is used. Alternatives include chemical release and UV release bonding materials. Release can be accomplished by applying ultra-violet (UV) light to a UV sensitive bonding material. Alternatively, an appropriate solvent could be employed to dissolve the bonding material. Other alternatives will be clear to those skilled in the art, including the application of a material that interacts with the bonding material to counter-act or otherwise neutralize the bonding materials adhesive/cohesive properties.

The glass or other substrate 41 has provided support during the wafer thinning and through-via processes described above, but it is now removed prior to the wafer 13 being diced into individual integrated circuits (dies). Unlike BSI sensors formed using prior known approaches, the finished devices 51A and 51B will not have the glass substrate 41 or the temporary bonding material (not shown) over them and in the light path between a system lens and the photodiodes, so that use of the embodiments increases the available light at the photodiodes and thus improves the quantum efficiency (QE) for the BSI image sensors.

Figure 12:
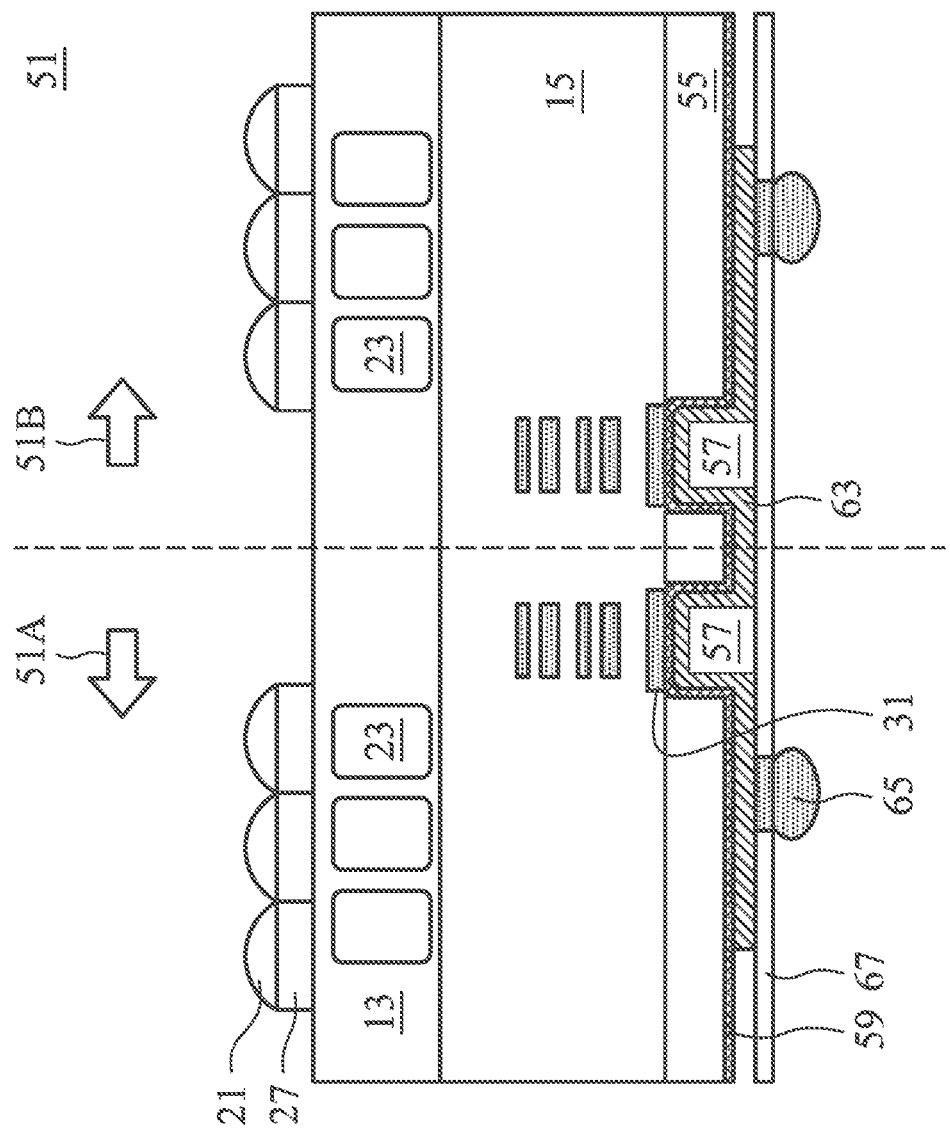
FIG. 12 depicts, in a cross sectional view, the active device wafer of FIG. 11, in a singulation process.

FIG. 12 depicts, in a cross sectional view, the active device wafer 51 in a dicing operation. Devices 51A and 51B will be separated by wafer sawing or dicing the wafer 13 in the portion between the devices. The devices 51A and 51B (and many more, only two devices are shown for simplicity, the wafer 13 will have many BSI devices formed thereon) will each be a BSI CIS integrated circuit that can then be mounted in a system using the external connectors 65.

Use of the embodiments provides CIS sensors without the glass substrate and bonding materials of the prior approach CSI sensors in the path between a system lens and the microlens material of the CIS sensor. Both FSI and BSI CIS sensors may benefit from the use of the embodiments. A sensor formed with the embodiments has the microlens material over the photodiodes exposed to air or the ambient environment, without being covered by glass or a bonding material, increasing the amount of light at the photodiodes.

In a method embodiment, the method includes forming a plurality of pixel arrays on a device wafer; bonding a substrate to the device wafer; thinning the device wafer; forming electrical connections on the device wafer after bonding the substrate to the device wafer; de-bonding the substrate from the device wafer; and singulating individuals ones of the plurality of pixel arrays from the device wafer. In a further embodiment, the above method includes wherein singulating includes sawing, lasering, scribing, pressing, etching, and combinations thereof. In still another embodiment, in the above methods the substrate comprises glass. In yet another embodiment, the device wafer includes a front side illumination (FSI) CMOS image sensor (CIS). In a further embodiment, in the above methods the substrate is bonded to the device wafer by a heat release bonding material. In another alternative embodiment, in the above methods, forming electrical connections on the device wafer further comprises thinning the device wafer to expose conductive through vias in the device wafer. In still another embodiment, in the above methods, forming electrical connections on the device wafer includes forming a conductive redistribution layer on the device wafer. In still another embodiment, in the above methods, forming electrical connections on the device wafer includes forming solder balls coupled to the conductive redistribution layer on the device wafer.

In yet another alternative embodiment, a method for forming a device includes forming a plurality of pixel arrays on a device wafer; bonding a carrier wafer to a first side of the device wafer; bonding a substrate over a second side of the device wafer; thinning the carrier wafer; forming electrical connections to the first side of the device wafer; subsequently de-bonding the substrate from the second side of the device wafer; and subsequently singulating individuals ones of the plurality of pixel arrays from the device wafer. In still a further embodiment, de-bonding the substrate comprises applying heat to a bonding material. In yet another embodiment, de-bonding the substrate comprises applying UV light to a bonding material. In still another embodiment, de-bonding the substrate comprises applying a chemical release agent to a bonding material. In still a further embodiment, in the above methods, forming electrical connections to the device wafer further comprises etching through-vias through the carrier wafer extending to metallization layers over the device wafer. In another alternative embodiment, forming electrical connections further comprises depositing conductive redistribution layer material into the through-vias. In yet another embodiment, forming electrical connections further comprises forming external connectors coupled to the conductive redistribution layer material. In still another embodiment, forming electrical connections further comprises forming external connectors that are ones selected from the group consisting essentially of solder balls, solder bumps, conductive pillars, conductive columns, lead based solder, lead free solder, stud bumps, and wire bonds. In yet another embodiment, in the above methods, the plurality of pixel arrays comprise back side illuminated (BSI) devices.

An apparatus embodiment includes a device wafer comprising photodiodes arranged in pixel arrays; color filter array material formed over the photodiodes and over a first surface of the device wafer; microlens material formed over the color filter array material; and external connectors formed over a second surface of the device wafer; wherein the microlens material is exposed. In still a further embodiment, in the above apparatus the device wafer further comprises a back side illuminated image sensor. In yet another alternative embodiment, in the above apparatus the device wafer further comprises a front side illuminated image sensor.

While the illustrative embodiments have been described herein with reference to specific example embodiments, this description is not intended to be construed in a limiting sense. Various modifications and combinations of the illustrative embodiments, as well as other alternative embodiments, will be apparent to persons skilled in the art upon reference to the description. It is therefore intended that the appended claims encompass any such modifications or embodiments.

What is claimed is:

1. A method for forming a device, comprising:
    forming a first plurality of photo-sensitive elements at a first major surface of a semiconductor wafer;
    forming a second plurality of photo-sensitive elements at the first major surface of the semiconductor wafer;
    forming metallization layers over the first major surface of the semiconductor wafer;
    bonding a temporary substrate to the semiconductor wafer above the first major surface;
    thinning a second major surface of the semiconductor wafer opposite the first major surface to expose a conductive element formed within the semiconductor wafer;
    forming electrical connections to the exposed conductive element at the thinned second major surface of the semiconductor wafer; and
    de-bonding the temporary substrate from the semiconductor wafer.

2. The method of claim 1, further comprising singulating the first plurality of photo-sensitive elements from the second plurality of photo-sensitive elements.

3. The method of claim 2, wherein singulating includes sawing, lasering, scribing, pressing, etching, and combinations thereof.

4. The method of claim 1, wherein the temporary substrate comprises glass.

5. The method of claim 1, wherein the temporary substrate is bonded to the semiconductor wafer by a heat release bonding material.

6. The method of claim 1, further comprising forming an opening partially through the semiconductor wafer and filling the opening with a conductor to form the conductive element.

7. The method of claim 5, further comprising forming a plurality of color filters and microlenses over the metallization layers.

8. The method of claim 7, wherein the heat release bonding material encapsulates the microlenses.

9. A method comprising:
    forming a plurality of photo-sensitive elements at a first major surface of a semiconductor wafer;
    forming a through via extending from the first major surface of the semiconductor wafer into the semiconductor wafer;
    building a plurality of metallic interconnect layers over the first major surface of the semiconductor wafer, the plurality of metallic interconnect layers including conductive features embedded within respective dielectric layers;
    adhering a handling substrate to a topmost surface of the plurality of metallic interconnect layers;
    thinning a second major surface of the semiconductor wafer to expose the through via;
    forming electrical connections on the thinned second major surface of the semiconductor wafer;
    removing the handling substrate; and
    singulating the semiconductor wafer into individual image sensor devices.

10. The method of claim 9, forming a through via includes etching or drilling partially through the semiconductor wafer to form a via opening, lining the via opening with a barrier layer, and filling the lined opening with a conductor.

11. The method of claim 9, wherein building a plurality of metallic interconnect layers includes forming copper conductors using a damascene process.

12. The method of claim 9, wherein adhering a handling substrate includes depositing a temporary bonding material on the topmost surface of the plurality of metallic interconnect layers and adhering the handling substrate using the temporary bonding material.

13. The method of claim 12, wherein depositing a temporary bonding material includes applying a heat release adhesive as a liquid to the topmost surface.

14. The method of claim 9, further comprising forming a plurality of color filter arrays over the plurality of photo-sensitive elements.

15. The method of claim 13, wherein removing the handling substrate includes applying heat to the temporary bonding material.

16. The method of claim 9, wherein singulating the semiconductor wafer includes sawing, lasering, scribing, pressing, etching, and combinations thereof.

17. The method of claim 9, wherein forming electrical connections includes forming a redistribution layer (RDL) on the second major surface of the semiconductor wafer.

18. The method of claim 17, further including forming a passivation layer over the RDL, the passivation layer including openings therein allowing electrical contact to the RDL.

19. A method comprising:
   forming a plurality of photo-sensitive elements at a first major surface of a semiconductor wafer;
   forming a through via extending from the first major surface of the semiconductor wafer into the semiconductor wafer;
   building a plurality of metallic interconnect layers over the first major surface of the semiconductor wafer, the plurality of metallic interconnect layers including conductive features embedded within respective dielectric layers;
   forming microlenses over the metallic interconnect layer;
   applying an adhesive that encapsulates the microlenses, and adhering a handling substrate to a topmost surface of the plurality of metallic interconnect layers using the adhesive;
   thinning a second major surface of the semiconductor wafer to expose the through via;
   forming electrical connections on the thinned second major surface of the semiconductor wafer;
   removing the handling substrate; and
   singulating the semiconductor wafer into individual image sensor devices.

20. The method of claim 19, wherein the adhesive is selected from the group consisting of heat releasable adhesives, UV releasable adhesives, pressure release bonding materials, and chemical release adhesives.

* * * * *